(12) United States Patent
Fujii

(10) Patent No.: US 6,437,409 B2
(45) Date of Patent: Aug. 20, 2002

(54) SEMICONDUCTOR DEVICE

(75) Inventor: Hiroki Fujii, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/781,252

(22) Filed: Feb. 13, 2001

(30) Foreign Application Priority Data

Feb. 14, 2000 (JP) ........................................ 2000-034820

(51) Int. Cl.[7] .............................................. H01L 29/02
(52) U.S. Cl. ...................... 257/379; 257/528; 257/531; 257/630; 438/238
(58) Field of Search ................................ 257/379, 528, 257/531, 630; 438/238

(56) References Cited

U.S. PATENT DOCUMENTS

2001/0015682 A1 * 8/2001 Matsumura et al. ........ 257/379

OTHER PUBLICATIONS

C. Patrick Yue et al., "On–Chip Spiral Inductors with Patterned Ground Shields for Si–Based RFIC's", *1997 Symposium on VLSI Circuits Digest of Technical Papers*, Jun. 12–14, 1997, pp. 85–86.

* cited by examiner

*Primary Examiner*—Edward Wojciechowicz

(57) ABSTRACT

The first shield pattern is provided between an inductor and the surface of a semiconductor substrate under the inductor. The first shield pattern has plural concave slittings from the side of the edge toward the inside. The second shield pattern provides a convex area which is located on the surface of the semiconductor substrate in correspondence with the slitting wherin metallic silicide is formed and a connection area which is provided on the surface of the semiconductor substrate and in which metallic silicide is formed for connecting plural convex areas.

25 Claims, 11 Drawing Sheets

SEMICONDUCTOR DEVICE

BACKGROUND OF THE INVENTION

1. Field of the Invention

The present invention relates to a semiconductor device, particularly but not limited to a semiconductor device having a MOS transistor and an inductor.

2. Description of the Related Art

An important characteristic of high frequency semiconductor device is to enhance the noise characteristics of the high frequency circuit by reducing noise caused in the substrate. As an inductor occupies a large area, in comparison to other circuit element, high frequency current flows in the substrate by coupling a wiring layer pattern composing the inductor and the substrate immediately under the inductor, thus causing noise in the substrate due to the resistance of the substrate. The noise has a negative effect upon the characteristics of the high frequency circuit To reduce the noise in the substrate, the method of the present invention provides a conductive layer made of a metallic suicide layer placed between an inductor pattern and a silicon substrate thus shielding conductive layer via metallic wire grounding However, as eddy current is caused in the metallic silicide layer a problem occurs wherein that the quality factor Q of the inductor deteriorates.

A conventional solution to the above problem is disclosed on page 85 and 86 of "1997 Symposium on VLSI Circuits Digest of Technical Papers" which teaches structuring an inductor for reducing eddy current by providing slitting to a metallic silicide layer. FIG. 1 is a plan view showing an example of the conventional solution. FIG. 2 is a sectional view along a line AA of FIG. 1 Referring to FIGS. 1 and 2, the example of the conventional solution will be described below.

In a semiconductor device 100, an inductor is formed by second-layer metallic wiring 114b of a spiral type inductor pattern. A polysilicon 105b and a metallic silicide 108b thereon is provided under the second-layer metallic wiring 114b with a first layer insulation film 109 and a second layer insulation film 112. The metallic silicide 108b on the surface of the polysilicon 105b is made of metal such as titanium, cobalt and nickel. The metallic silicide 108b is thus located between the second-layer metallic wiring 114b and the polysilicon 105b. Also, concave slitting 115 is provided to the polysilicon 105b directionally inward from the side of the outer edge.

One end of the inductor is connected to the polysilicon 105a, via a through hole 113, first layer metallic wiring 111 and a contact hole 110. The polysilicon 105a is the gate electrode of an N-channel MOS transistor 120. In FIGS. 1 and 2, reference numeral 101 denotes a P-type silicon substrate, 102 denotes an element isolation oxide film, 103 denotes a P-type well, 106 denotes a side wall of an insulating film, 107 denotes N-type source and drain areas, 108c denotes metallic suicide and 114a denotes second-layer metallic wiring.

To clarify the characteristics of the conventional structure, a plan view at the stage at which the metallic silicides 108a, 108b and 108c are formed is shown in FIG. 3. As shown in FIG. 3, hatching sloping leftward and downward is provided for the metallic silicide 108a on the polysilicon 105a of the gate electrode and the metallic silicide 108b on the polysilicon 105b under the inductor pattern in common. Hatching sloping rightward and downward is provided for the metallic silicide 108c formed on the surface of the silicon substrate where the N-type source and drain areas 107 of the N-channel MOS transistor 120.

According to this structure, as the metallic silicide layer 108b on the polysilicon 105b under the inductor pattern is grounded, noise caused in the P-type silicon substrate 101 can be reduced to a considerable extent. Furthermore, as slitting 115 is provided to the polysilicon 105b and the metallic silicide layer 108b respectively under the inductor pattern, eddy current can also be prevented.

However, in this example of the conventional solution, as an area of the slitting 115 of the polysilicon 105b is not shielded, high frequency current cannot be prevented from flowing to the P-type silicon substrate 101 through the area of the slitting 115. This causes a problem of antimony. Thus, as more slittings 115 are provided to complete the inhibition of eddy current, the shielding performance is conversely deteriorated.

An aspect of the invention is to provide a semiconductor device wherein the above-mentioned problem of antinomy is solved. The semiconductor device of the present invention enables the enhancement of the performance of shielding and the inhibition of eddy currant respectively between an inductor and a substrate. Therefore, the noise in the substrate can be reduced and the deterioration of the quality factor Q of the inductor, due to eddy current, can also be inhibited.

SUMMARY OF THE INVENTION

In an embodiment of the semiconductor device of the present invention, a semiconductor device wherein a circuit in which an active device including a MOS transistor and an inductor are mixed is mounted on a semiconductor substrate and is provided with a first shield pattern made of a conductive film. The first shield pattern is provided between an inductor and the surface of a semiconductor substrate under the inductor thus insulating the inductor from the surface of the semiconductor substrate by a fist insulating film, is insulated from the inductor by a second insulating film and is provided with plural concave slittings from the side of the edge toward the inside and a second shield pattern provided a convex area which is located on the surface of the semiconductor substrate in registration with the slitting and in which metallic silicide is formed and a connection area which is provided on the surface of the semiconductor substrate and in which metallic silicide is formed for connecting plural convex areas.

In another embodiment of a semiconductor of the present invention, a semiconductor device wherein a circuit in which an active device including a MOS transistor and an inductor arc mixed is mounted on a semiconductor substrate and is provided with a first shield pattern made of metallic silicide which is provided on the surface of a semiconductor substrate under an inductor and is provided with plural concave slittings from the side of the edge toward the inside and a second shield pattern provided between the inductor and the surface of the semiconductor substrate, insulated from the surface of the semiconductor substrate by a first insulating film, insulated from the inductor by a second insulating film and provided with a convex conductive film provided on the surface of the semiconductor substrate in registration with the slitting and a connection area made of the conductive film for connecting the plural convex conductive films

BRIEF DESCRIPTION OF THE DRAWINGS

The above and other objects, advantages and features of the present invention will be more apparent from the following description taken in conjunction with the accompanying drawings, in which:

FIG. 22 is a plan view when a metallic silicide is formed in a first example of the second embodiment of the present invention; and.

BRIEF DESCRIPTION OF THE PREFERRED EMBODIMENTS

A semiconductor device in a first embodiment of the invention is provided with a first shield pattern and a second shield pattern. The first shield pattern is made of a conductive film which is provided between an inductor and the surface of a silicon substrate under the inductor. The first shield pattern is electrically insulated from the surface of the silicon substrate by a first insulating film. The first shield pattern is electrically insulated from the inductor by a second insulating film. The first shield pattern is provided with plural concave slittings directionally inward from the side of the outer edge. The second shield pattern comprises a convex area and a connection area. The convex area is provided on the surface of the silicon substrate. The convex area is made of metallic silicide formed in corresponding with the concave slitting. The connection area connects plural convex areas.

Figure 4:
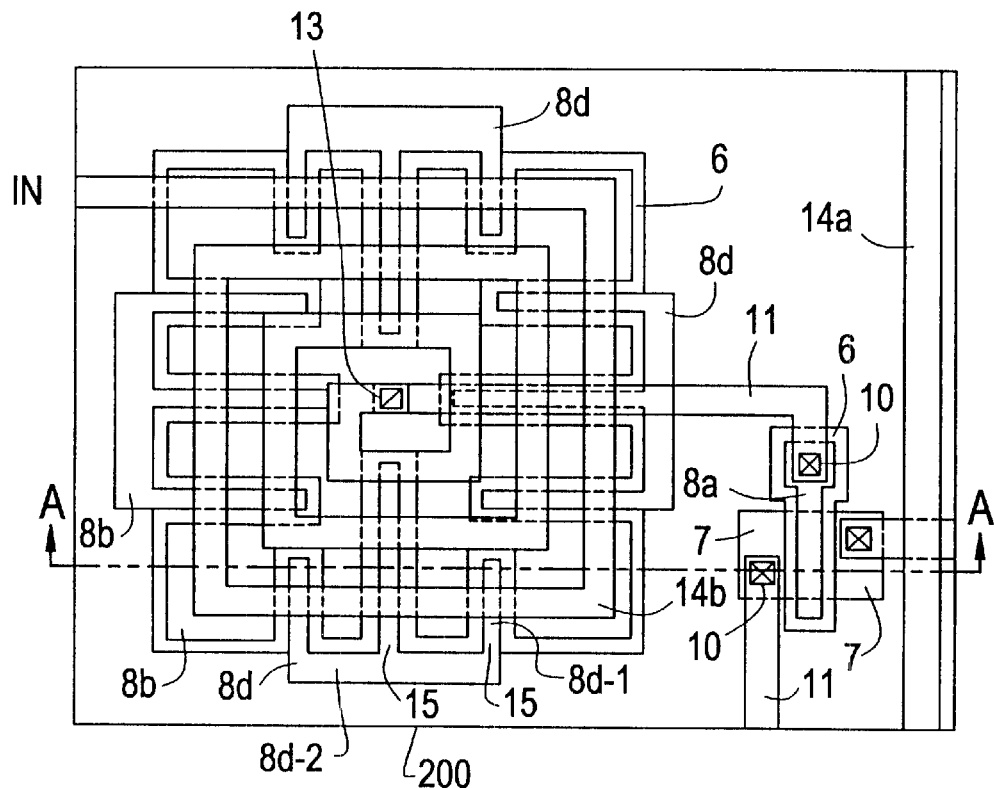
FIG. 4 is a plan view showing a first example of a first embodiment of the present invention.
Figure 5:
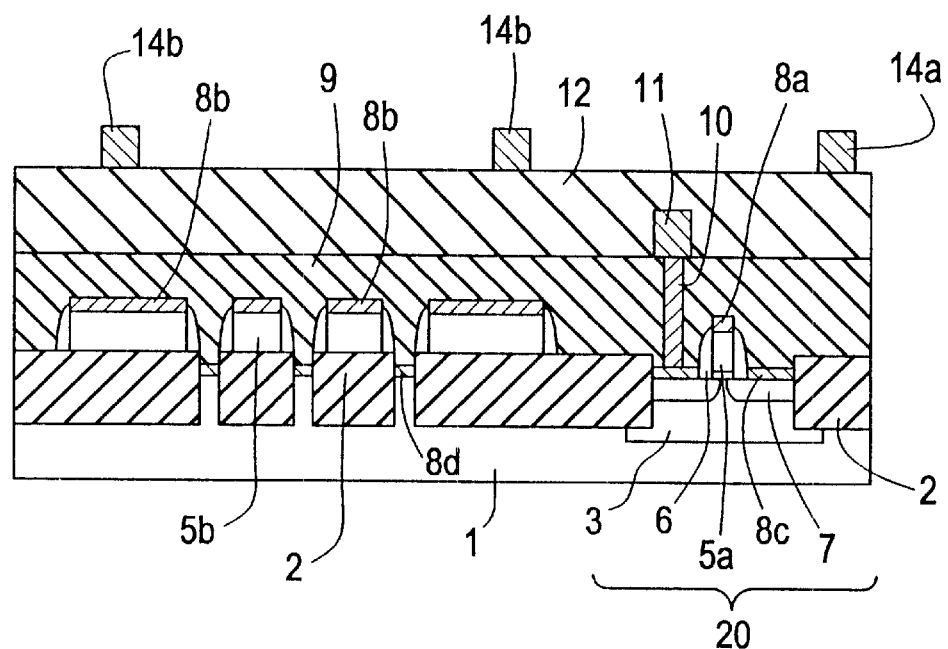
FIG. 5 is a sectional view viewed along a line AA of FIG. 4.

FIGS. 4 and 5 show a first example of a first embodiment of the invention, FIG. 4 is a plan and FIG. 5 is a sectional view along a line AA of FIG. 4.

In a semiconductor device 200, a spiral type second-layer metallic wiring 14b is provided as an inductor. A polysilicon 5b is provided as a conductive film under the inductor with first and second layer insulation films 9 and 12. The first and second layer insulation films 9 and 12 are formed between the inductor 14b and the polysilicon 5b as a second insulating film. The polysilicon 5b has metallic silicide 8b made of metal such as titanium, cobalt and nickel (are they connected) The polysilicon 5b, having a concave slitting 15, is formed as a first shield pattern. The polysilicon 5b is insulated from the P-type silicon substrate 1 by an element isolation oxide film 2 of a first insulating film. The slitting of the element isolation oxide film 2 is formed in correspondence with the polysilicon 5b, accurately with a sidewall 6 of the polysilicon 5b.

Metallic silicide 8d is provided on the surface of the P-type silicon substrate 1. The metallic silicide comprises convex metallic silicide 8d-1 in a shape similar to the slitting 15 and a metallic silicide connection area 8d-2 for connecting plural convex metallic silicides 8d-1. The metallic silicide 8d is provided as the second shield pattern.

The first shield pattern of the metallic silicide 8b and the second shield pattern of the metallic silicide 8d are both connected to a ground power source by a ground connection not shown. Either the first shield pattern or the second shield pattern exists between the second-layer metallic wiring 14b of the inductor and the P-type silicon substrate 1. Thus, substrate noise caused by coupling the second-layer metallic wiring 14b of the inductor and the P-type silicon substrate 1, can be prevented, even when multiple slittings are provided to prevent the deterioration of the quality factor Q of the inductor due to eddy current.

Figure 1:
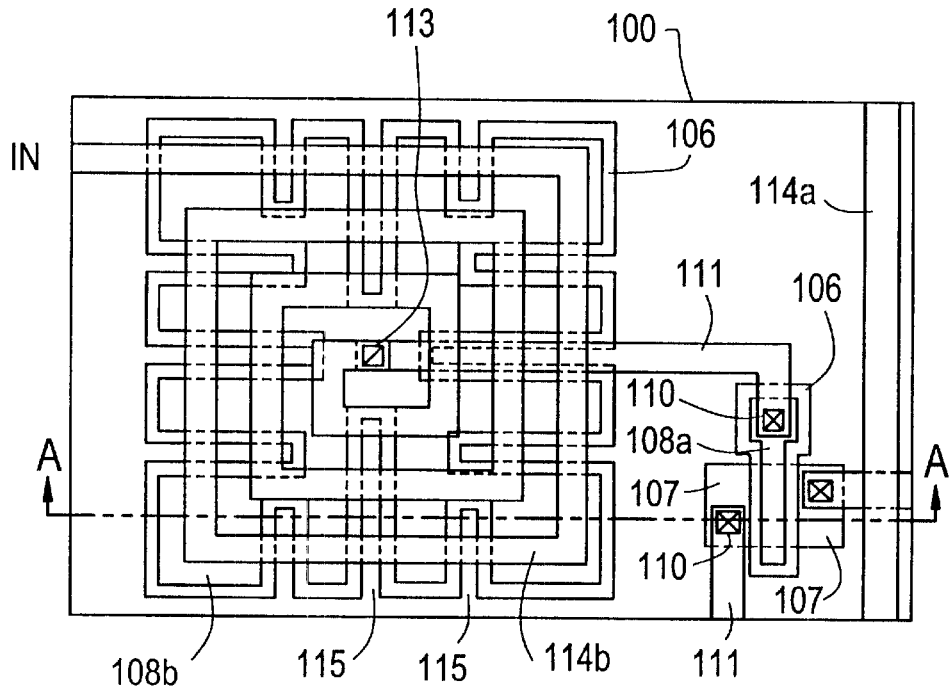
FIG. 1 is a plan view showing a conventional semiconductor device.

One end of the inductor 14b is connected to the polysilicon 5a via a through hole 13, first-layer metallic wiring 11 and a contact hole 10. The polysilicon 5a is the gate electrode of an N-channel MOS transistor 20. As shown in FIGS. 1, reference numeral 2 denotes an element isolation oxide film for electrically isolating the N-type source and drain areas 7 of the N-channel MOS transistor and the source and drain areas of another MOS transistor not shown, 3 denotes a P-type well, 6 denotes a side wall of an insulating film, 8a denotes metallic silicide formed on the surface of the polysilicon 5a of the gate electrode of the MOS transistor, 8c denotes metallic silicide formed on the surface of the source and drain areas and 14a denotes second-layer metallic wiring.

FIGS. 6 to 9 are sectional. views showing a manufacturing process of the semiconductor device in the first example of the first embodiment. Other manufacturing methods may be used and thus the invention is not limited to the manufacturing method described herein.

Figure 6:
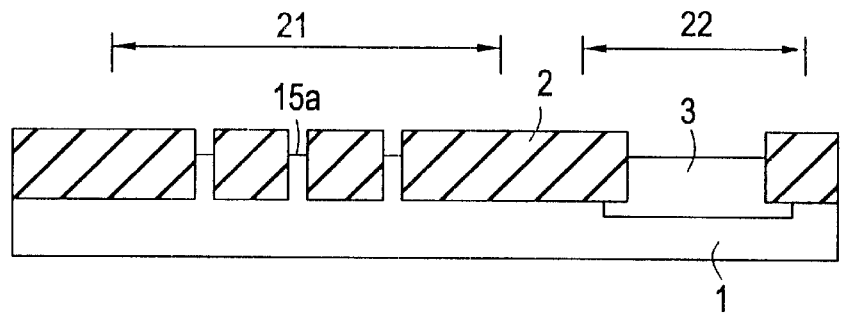
FIG. 6 is a sectional view showing a manufacturing method of a semiconductor device in the first example of the first embodiment.

First, as shown in FIG. 6, an element isolation oxide film 2 is selectively formed on the surface of a P-type silicon substrate 1. The element isolation oxide film 2 has the thickness of about 200 to 500 nm. At this time, no element isolation oxide film 2 is formed in an area 15a in which slitting is to be formed in an inductor formation area 21.

Figure 7:
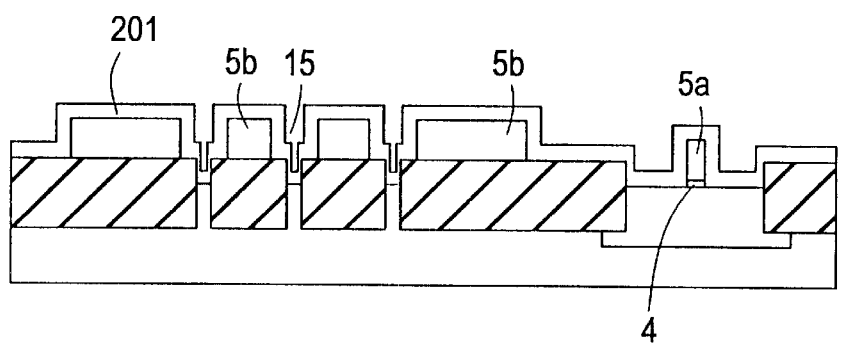
FIG. 7 is a sectional view showing a manufacturing method of a semiconductor device in the first example of the first embodiment.

Next, as shown in FIG. 7, after a P-type well 3 is formed, a gate oxide film 4 having the thickness of about 2 to 10 nm and polysilicon having about 100 to 400 nm thick are sequentially grown. By patterning the gate oxide film 4 and the polysilicon using resist as a mask, polysilicon 5a of a gate electrode is formed. At this time, polysilicon 5b having slitting 15 is formed on the surface of the element isolation oxide film 2 in the inductor wiring formation area 22. After the polysilicon 5a and 5b is formed, an insulating film 201 is grown.

Figure 8:
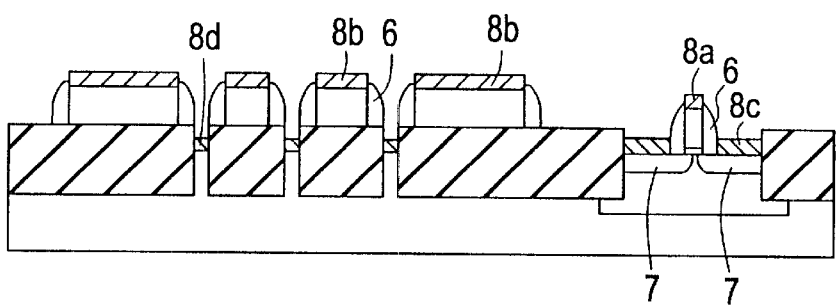
FIG. 8 is a sectional view showing a manufacturing method of a semiconductor device in the first example of the first embodiment.

Next, as shown in FIG. 8, the insulating film 201 is etched back and a side wall 6 is formed. Then, N-type source and drain areas 7 of an N-channel MOS transistor 20 (and the P-type source and drain areas of a P-channel MOS transistor not shown) ire formed by ion implantation. Further, heat treatment is applied to them at about 1000 to 1100 C for about 10 to 60 seconds by rapid thermal annealing (RTA) and ion impurities in the source and drain areas 7 are activated. Afterward, the surface of the silicon 1 and the surface of the polysilicon 5a and 5b where metallic silicide is to be formed are exposed. Then, for example cobalt is deposited on these surfaces and a heat treatment is applied. Metallic silicide 8a, 8c, 8b and 8d are thereby respectively formed on the polysilicon 5a of the gate of the MOS transistor 20 on the N-type source and drain areas 7, on the polysilicon 5b where the inductor wiring is to be formed and on the P-type silicon substrate 1 at the slitting 15.

Figure 9:
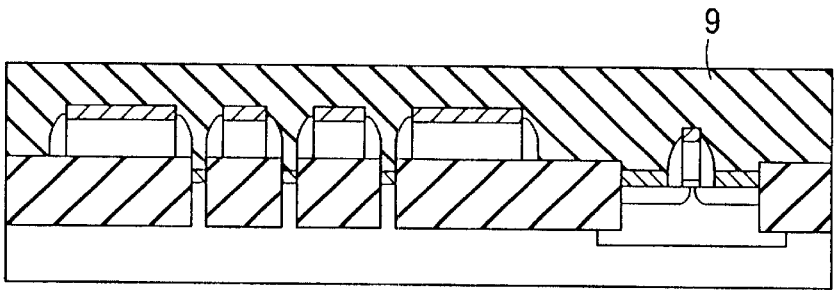
FIG. 9 is a sectional view showing a manufacturing method of a semiconductor device it the fist example of the first embodiment.

Afterward, as shown in FIG. 9, a first layer insulation film 9 is grown so that it has the thickness of about 800 to 1200 nm. Then, as shown in FIG. 5, a contact hole 10 is formed in the first layer insulating film 9 by using a resist as a mask. A metallic film of tungsten and others is embedded in the contact hole 10. A metallic film of aluminum and others is grown on the first layer insulation film 9 so that it has the thickness of about 400 to 800 nm. By patterning the metallic film with using a resist as a mask, the first-layer metallic wiring 11 is formed. Furthermore, a second layer insulation film 12 is grown so that it has the thickness of about 800 to 1200 nm. Then, a through hole 13 is formed in a required location of the second larger insulation film 12 by using a resist as a mask. A metallic film of tungsten and others is embedded in the through hole 13 while a metallic film of aluminum and others is grown so that it has the thickness of about 400 to 800 nm. By patterning the metallic film using a resist as a mask, the second-layer metallic wiring as an inductor wiring 14b and the connection wing is formed.

Figure 10:
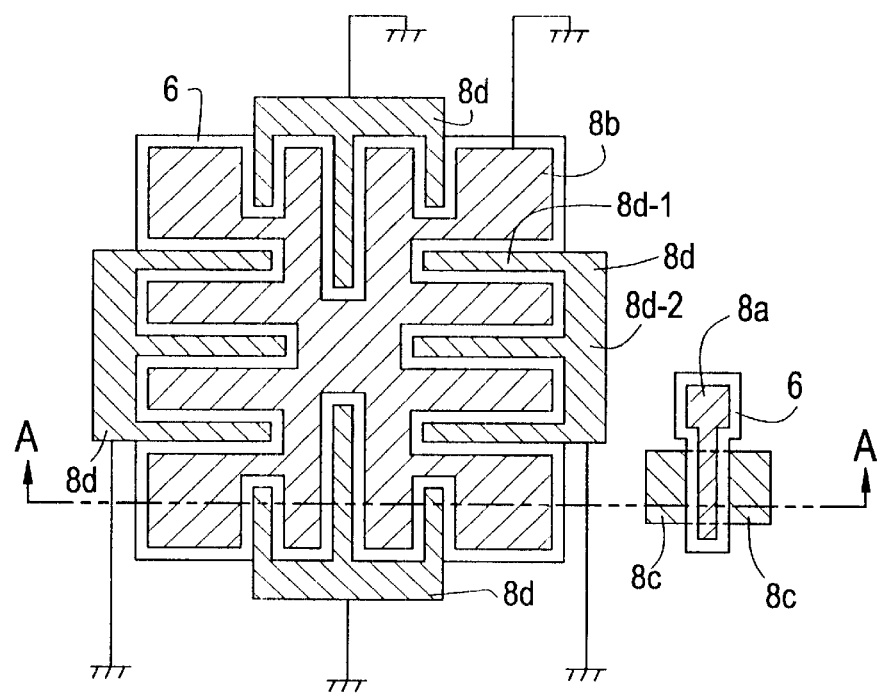
FIG. 10 is a plan view showing the manufacturing process shown in FIG. 8.

FIG. 10 is a plan showing the stage of FIG. 8. FIG. 8 is a sectional view viewed along the line AA of FIG. 10. As shown in FIG. 10, hatching sloping leftward and downward is added to the metallic silicide 8a on the polysilicon 5a of the gate electrode and the metallic silicide 8b of the first shield pattern on the polysilicon 5b under an inductor pattern. Hatching sloping rightward and downward is added to the metallic silicide 8c on the N-type source and drain areas 7 of the N-channel MOS transistor 20 and the metallic silicide 8d of the second shield pattern on the P-type silicon substrate at a convex area corresponding with the slitting 15. The metallic silicide 8b and 8d are connected to a ground power source by a ground connection (not shown).

Figure 11:
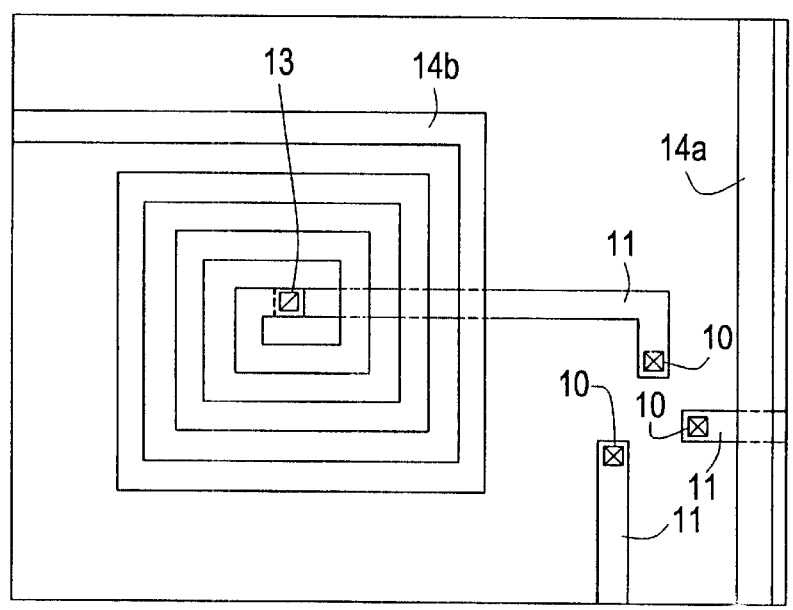
FIG. 11 selectively shows first-layer metallic wiring 11, second-layer metallic wiring 14a and 14b and a contact hole 10 and a through hole 13 in the plan shown in FIG. 4.

FIG. 11 selectively shows the first-layer metallic wiring 11, the second-layer metallic wiring 14a and 14b, the contact hole 10 and the through hole 13 in the plan shown in FIG. 4. The second-layer metallic wiring 14b is formed in a spiral shape as the inductor.

In this embodiment, the metallic silicide layer 8b on the polysilicon 5b is provided as the first shield pattern. Also, the silicide layer 8d is provided at the slitting 15 of the first shield pattern as the second shield pattern. therefore, the coupling of the inductor and the silicon substrate is substantially cut off. Thus, noise in the substrate can be effectively inhibited. Further, the metallic silicide layer 8b as the first shield pattern and the metallic silicide layer 8d at the slitting 15 as the second shield pattern are isolated at least by the sidewall 6. Thus, eddy current is inhibited and the quality factor Q of the inductor can be also enhanced.

One embodiment of the semiconductor device of the present invention and its manufacturing method has described above with reference to the drawings. But concrete constitution is not limited to the present embodiment, and design can be changed within the scope of the present invention.

Figure 12:
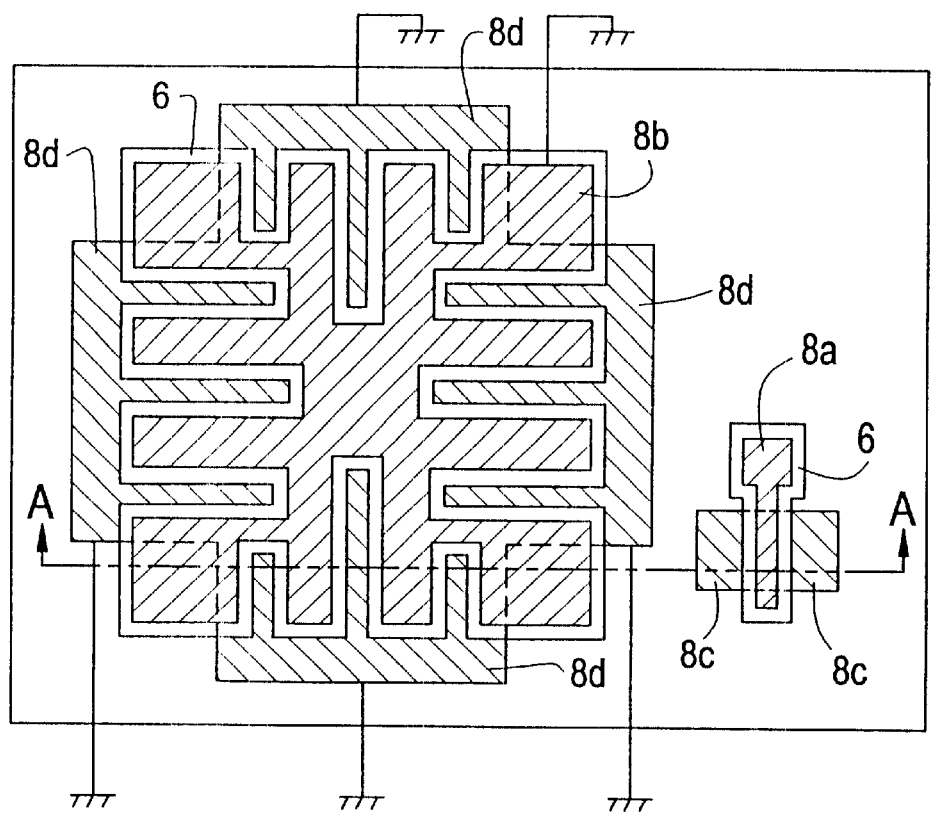
FIG. 12 is a plan view showing a second example of the fist embodiment of the present invention;.
Figure 13:
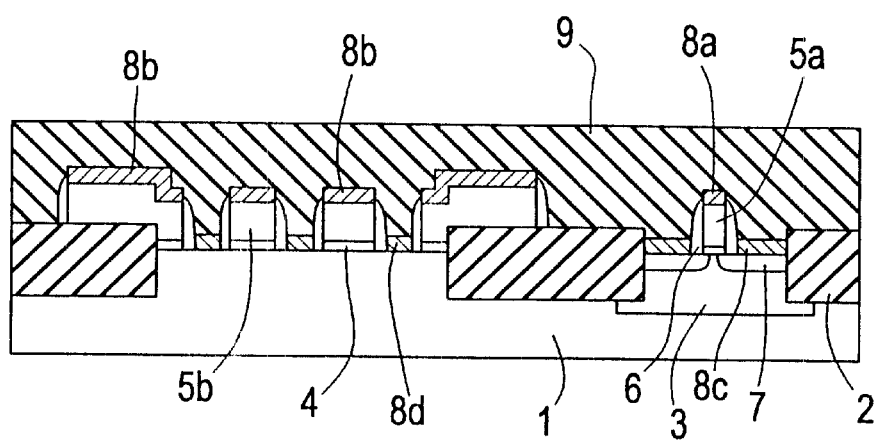
FIG. 13 is a sectional view viewed along a line AA of FIG. 12.

FIG. 12 is a plan view showing a second example of the first embodiment. FIG. 13 is a sectional view along the line AA of FIG. 12. This example is different from the first example of the first embodiment shown in FIGS. 4 and 5 in a gate oxide film 4. The gate oxide film 4 of a MOS transistor 20 is used as a first insulating film. The gate oxide film 4 is formed between polysilicon 5b under an inductor 14b and a P-type silicon substrate 1. In this example, either a first shield pattern 5b or a second shield pattern 8d exists between second-layer metallic wiring 14b of the inductor and the P-type silicon substrate 1, as in the first example. Thus, the coupling of the second-layer metallic wiring 14b as the inductor and the P-type silicon substrate 1 can be completely prevented, even if multiple slittings are provided to inhibit eddy current. Further, in this example, as metallic silicide 8b and metallic silicide 8d can be formed by self alignment, metallic silicide 8b and 8d can be formed more easily and more precisely than in the first example.

Figure 14:
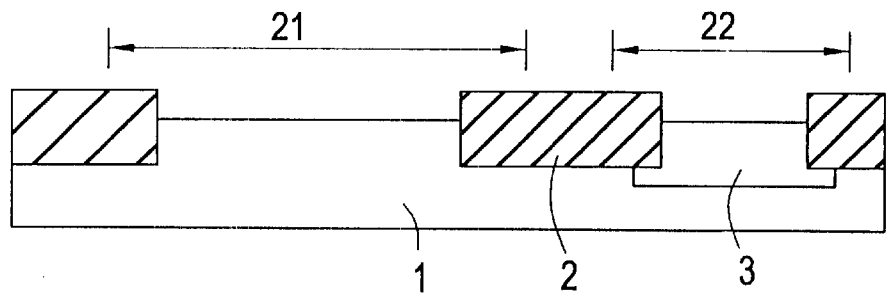
FIG. 14 is a sectional view showing a manufacturing method of a semiconductor device in the first example of the second embodiment.
Figure 15:
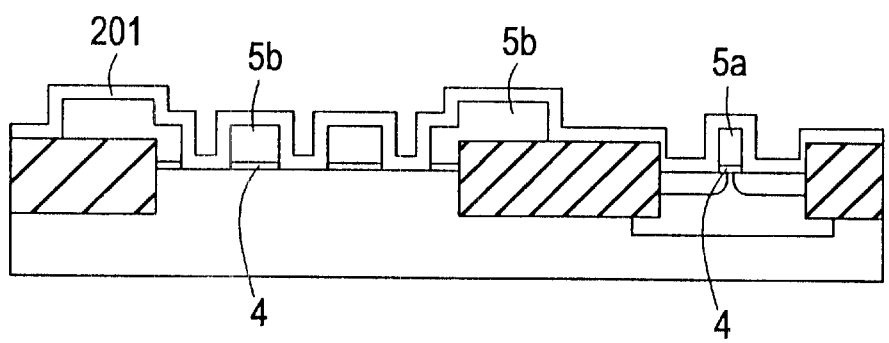
FIG. 15 is a sectional view showing a manufacturing method of a semiconductor device in the first example of the second embodiment.
Figure 16:
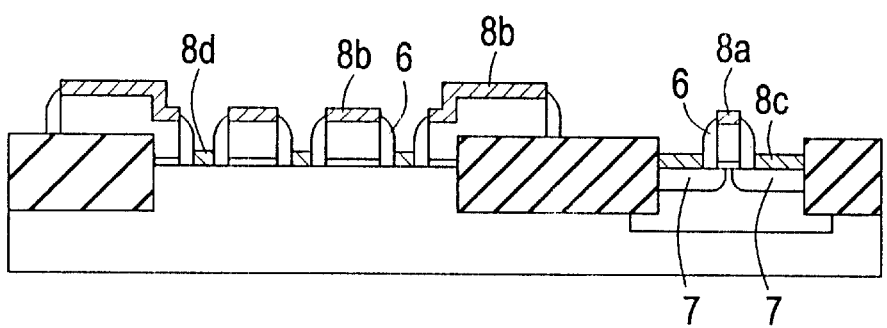
FIG. 16 is a sectional view showing a manufacturing method of a semiconductor device in the first example of the second embodiment.

FIGS. 14 to 16 are sectional views showing the manufacturing processes of the semiconductor device in the second example of the first embodiment. FIGS. 14 to 16 are different from FIGS. 6 to 8 in the inductor formation area 21. However, they show similar manufacturing processes in the other area.

FIG. 14 is the sectional view an element isolation oxide film 2 is formed. FIG. 14 is similar to FIG. 6, however, no element isolation oxide film is formed in an inductor formation area 21 in FIG. 14.

FIG. 15 is the sectional view showing an insulating film for a side wall 201 that is grown. FIG. 15 is similar to FIG. 7. Polysilicon 5b in the inductor formation area 21 is provided on a gate oxide film 4n FIG. 15.

Figure 2:
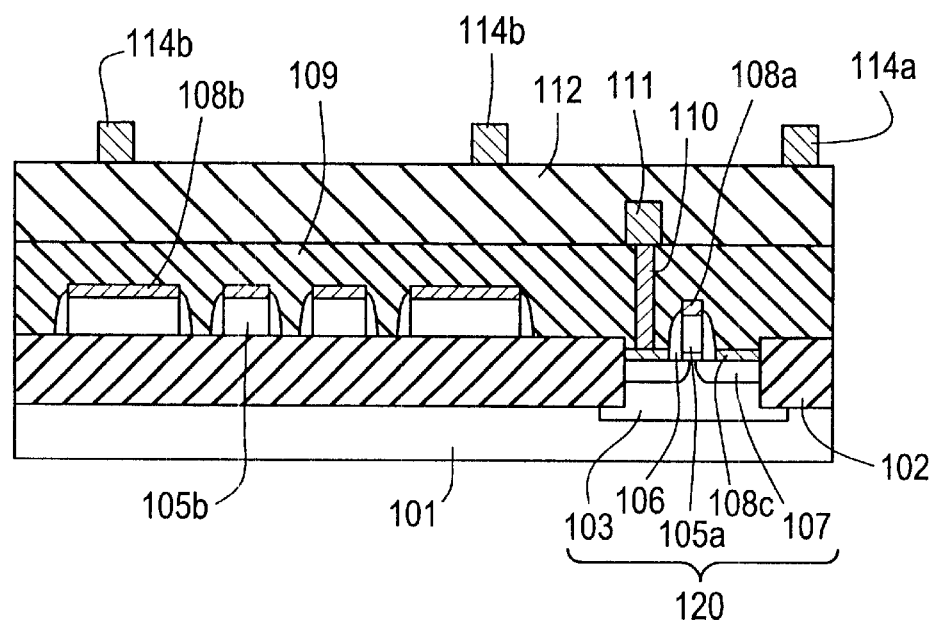
FIG. 2 is a sectional view viewed along a line AA of FIG. 1.
Figure 3:
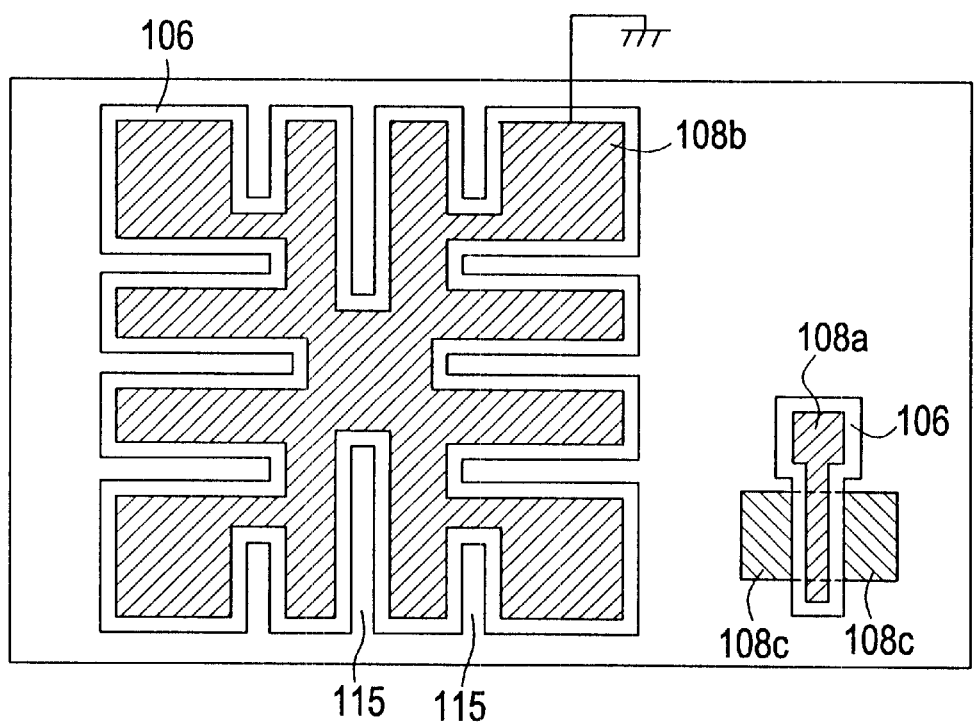
FIG. 3 is a plan view at the state at which metallic silicide 108a and 108b are formed in the conventional semiconductor device.

FIG. 16 is the sectional view showing after metallic silicide 8a, 8b, 8c and 8d is formed. FIG. 16 is similar to FIG. 2C. The metallic silicides 8a and 8c in the transistor area 22 are formed by self-alignment. Also, the metallic silicide 8b on the polysilicon 5b and metallic silicide 8d on the P-type silicon substrate 1 are formed off the interval of the side wall 6 by self-alignment in the inductor formation area 21.

Figure 17:
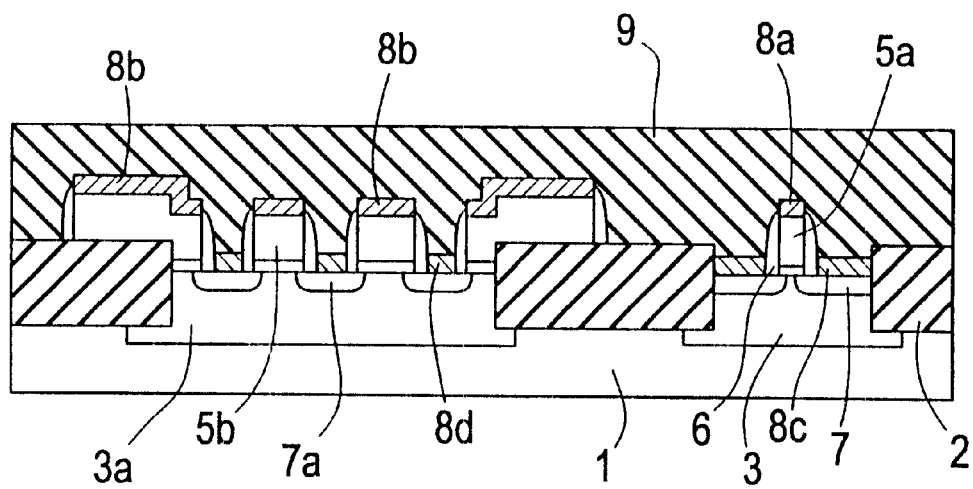
FIG. 17 is a plain view showing a third example of the first embodiment of the present invention;.
Figure 18:
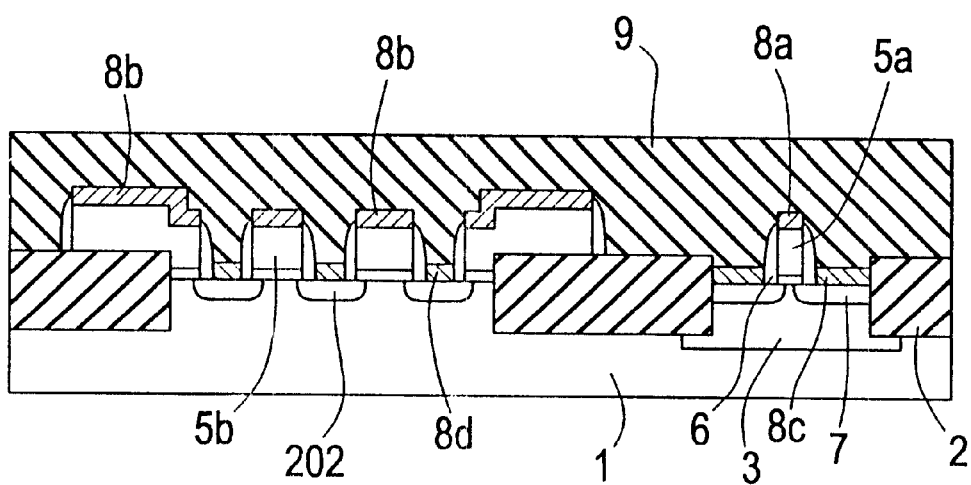
FIG. 18 is a plain view showing a forth example of the first embodiment of the present invention.
Figure 19:
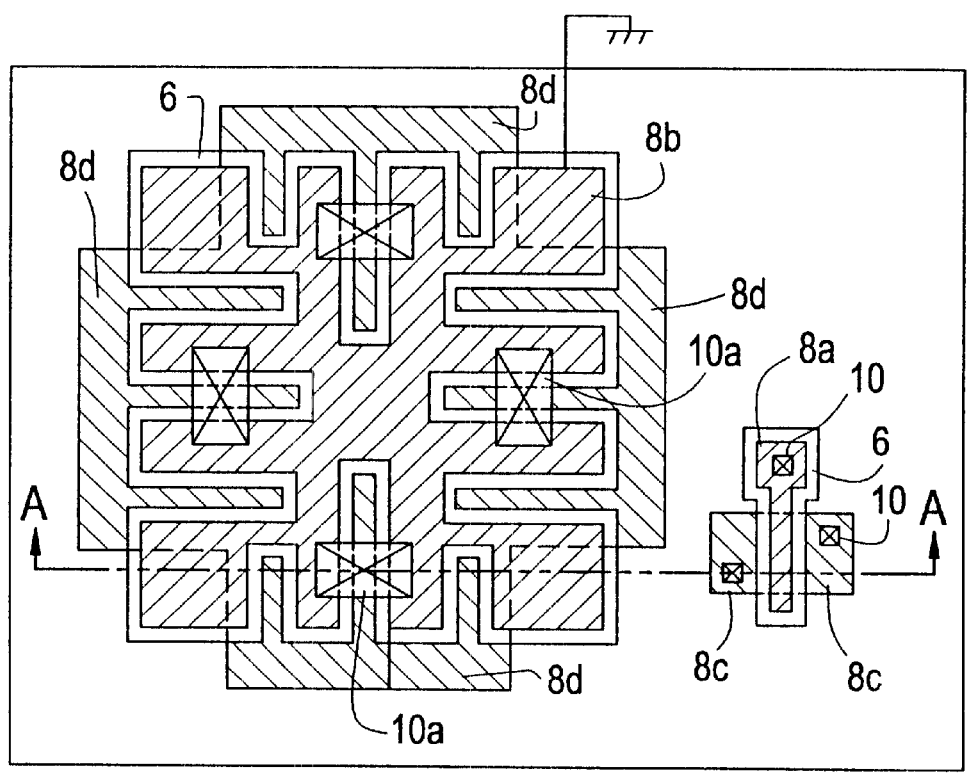
FIG. 19 is a plan view showing a fifth example of the first embodiment of the present invention.
Figure 20:
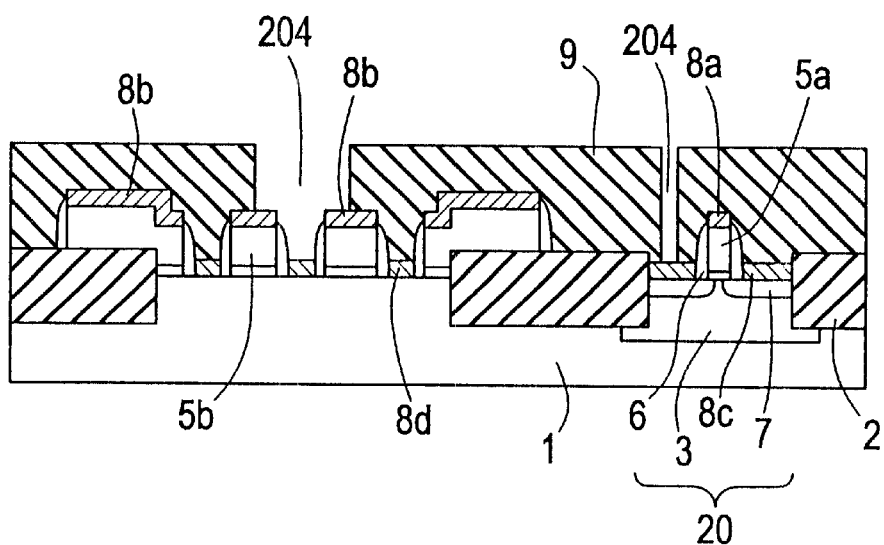
FIG. 20 is a sectional view viewed along a line AA of FIG. 19;.
Figure 21:
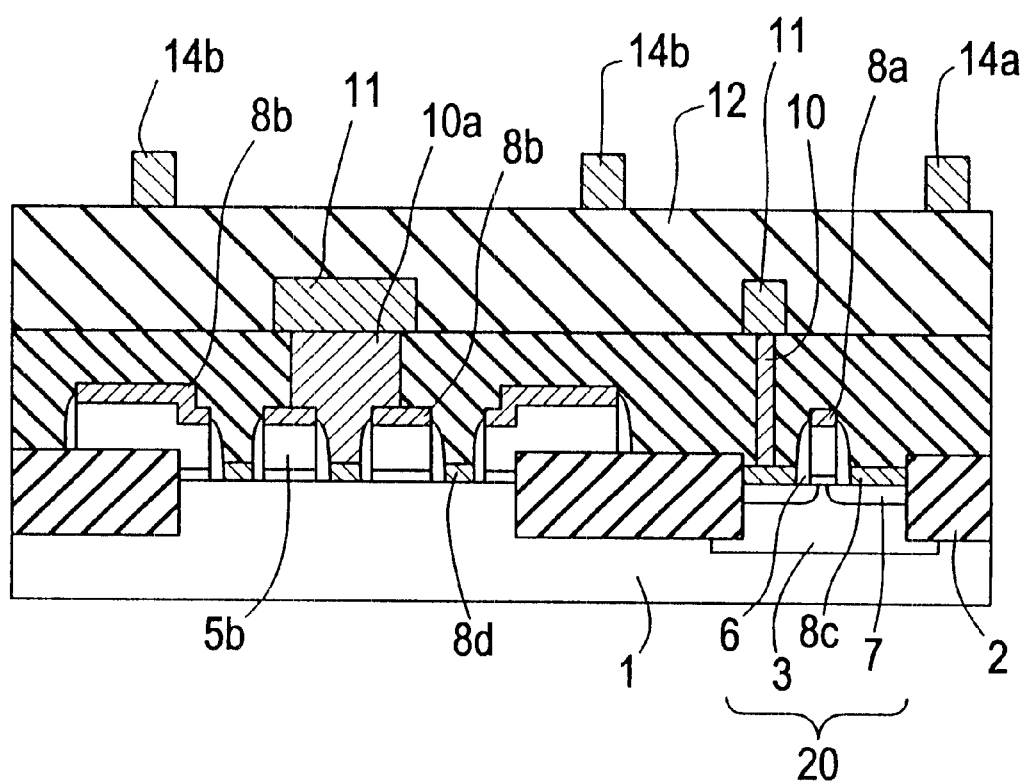
FIG. 21 is a sectional view showing the fifth example of the first embodiment.

FIGS. 17 and 18 respectively shows the tied and the fourth example of the first embodiments. As shown in FIG. 17, metallic silicide 8d under an inductor 14b may be formed on an N-type area 7a similar to the N-type source and drain areas 7 of the N-channel: MOS transistor 20. Also, a P-type well 3a may be omitted. As shown in FIG. 18, metallic silicide: 8d may be formed on a P-type area 202 similar to the P-type source and drain of a P-channel MOS transistor not shown FIG. 19 is a plan view showing a fifth example of the first embodiment FIG. 20 is a sectional view along the line AA of FIG. 19. FIG. 21 is a sectional view where an inductor 14b is formed. In the fifth example, a contact hole 10a is provided across a metallic silicide 8b and a metallic silicide 8d. The metallic silicide layer 8b on the polysilicon 5b is provided as a first shield pattern. The metallic silicide layer 8d on a P-type semiconductor substrate 1 is provided as a second shield patter. A contact opening 204 is provided as shown in FIG. 20 Then, metal such as tungsten is embedded in a contact hole 10 of a MOS transistor 20 wherein the metal is also embedded in the contact hole 10a so as to connect the first shield pattern 8b and the second shield pattern 8d. In his example, only either the first shield pattern or the second shield pattern has to be connected to a ground power source by a ground connection. Thus, wiring can be reduced.

Next, the second embodiment of the invention will be described. A semiconductor device in the second embodiment is provided with a first shield pattern and a second shield pattern. The first shield pattern is made of metallic silicide provided on the surface of a silicon substrate under an inductor. The first shield pattern is provided with plural concave sittings directionally inward. The second shield pattern is provided between the inductor and the surface of the silicon substrate. The second shield pattern is insulated from the surface of the silicon substrate by a first insulating film, and is insulated from the inductor by a second insulating film. The second shield pattern comprises a convex conductive film and a connection conductive film. The convex conductive film is provided in correspondence with the concave slitting of the first shield pattern. The connection conductive film connects plural convex conductive films.

Figure 22:
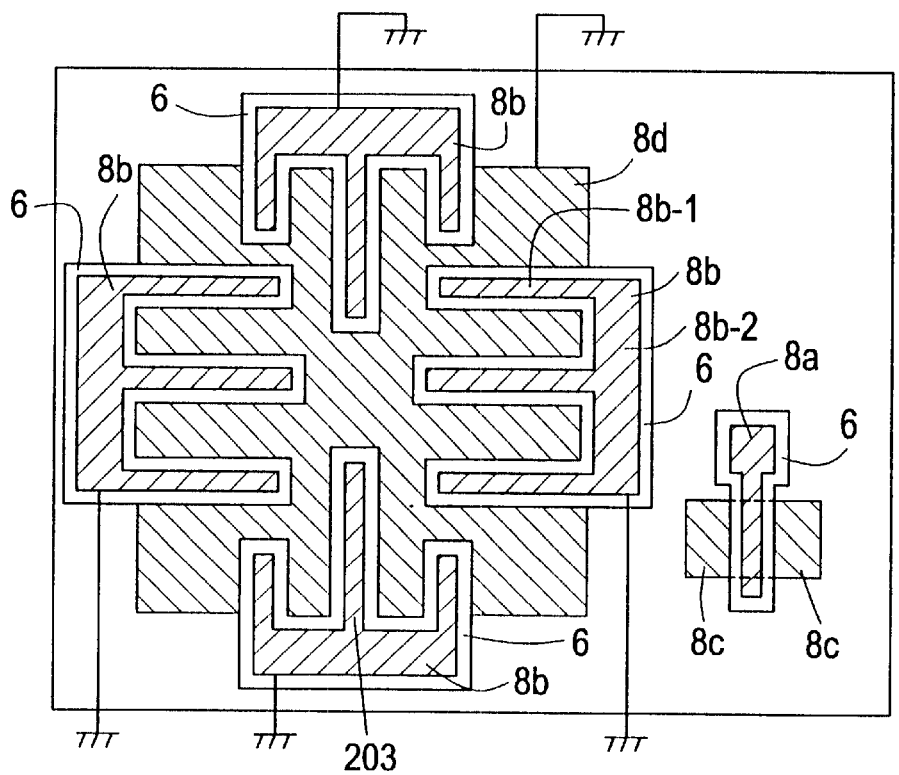
Figure 23:
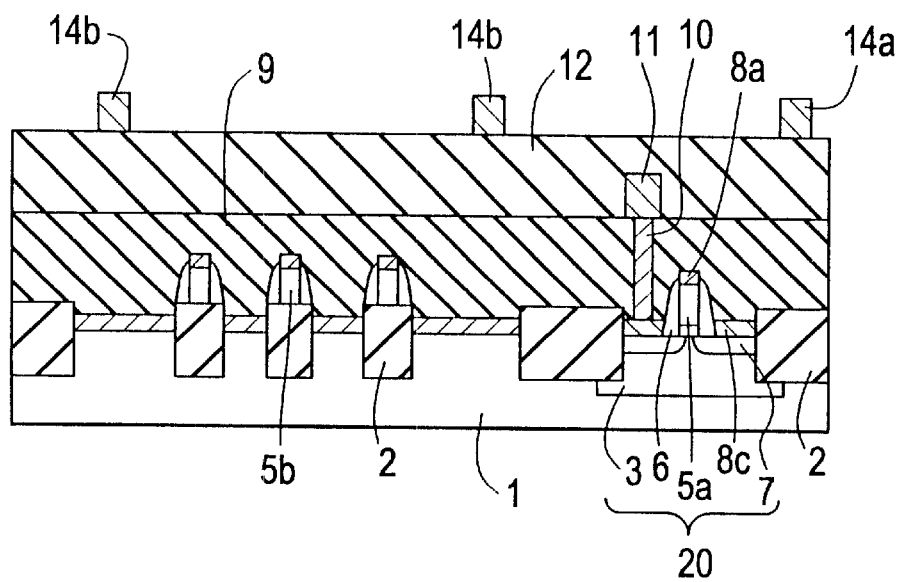
FIG. 23 is a sectional view at the state at which a second-layer metallic wiring including an inductor is formed.

FIG. 22 is a plan view when metallic silicide 8a is formed in a first example of the second embodiment of the invention. FIG. 22 corresponds to FIG. 10 in the first example of the first embodiment. FIG. 23 is a sectional view when second-layer metallic wiring including the inductor 14b is formed. FIG. 23 corresponds to FIG. 5. In FIG. 22, as in FIG. 10, metallic silicide 8a and 8b on the surface of polysilicon are provided with oblique lines sloping rightward and downward. The metallic silicide 8c and 8d on the silicon substrate is provided with oblique lines sloping leftward and downward This example is different from the first example of the first embodiment shown in FIG. 5 and FIG. 10. The metallic silicide 8d on the P-type silicon substrate 1 is the fist shield pattern having concave slitting 203. The metallic silicide 8b on polysilicon 5b is the second shield pattern having a convex portion 8b-1 corresponding with the concave slitting and a connection area 8b-2.

The first shield pattern 8d having the concave slitting usually occupies a larger area than the second shield pattern 8b having the convex portion. The first shield pattern 8d having a larger area is formed on the surface of the silicon substrate in this embodiment. Therefore, there is an effect of total parasitic capacity between the inductor 14b and the first or second shield pattern 8d and 8b can be reduced. Thus, the resonance frequency of the inductor can be increased. In this second embodiment as in the first embodiment, a gate oxide film may be used instead of the element isolation oxide film 2 in FIG. 23. The gate oxide film is provided as the first insulating film under the polysilicon film 5b shown in FIG. 12. The metallic silicide 8d may be formed on the surface of N-type silicon substrate under the first shield pattern as shown in FIG. 17. Also, the metallic silicide 8d may be formed on the surface of P-type silicon substrate under the first shield pattern as shown in FIG. 18. The Contact hole may be formed across the metallic silicide 8d as the first shield pattern and the metallic suicide layer 8b as the second shield pattern. The contact hole may be embedded by a metallic film of tungsten and others as shown in FIGS. 19 and 20. Thus, the number of wiring to a ground power source can be reduced.

As described above, according to the first embodiment of the invention, the coupling of the inductor and the silicon substrate can be substantially cut off by the first and second shield patterns. Thus, noise in the substrate can be effectively inhibited. Further, the metallic silicide layer as the first shield pattern and the metallic silicide layer at the slitting as the second shield pattern are isolated by a side wall of the insulating film. Thus, eddy current is inhibited and the quality factor Q of the inductor can be also enhanced.

Also, in the second embodiment of the invention, total parasitic capacity between the inductor and the first or second shield pattern can be reduced. Therefore, the resonance frequency of the inductor can be increased in addition to the above-mentioned effect.

It is apparent that the present invention is not limited to the above embodiments, but may be modified and changed without departing from the scope and spirit of the invention.

What is claimed is:

1. A method of manufacturing a semiconductor device comprising:

forming a first insulating layer on a substrate to expose a part of said substrate;

forming a first shield pattern over said first insulating layer;

forming a second shield pattern on said part of said substrate;

forming a second insulating layer; and forming an inductor pattern on said second insulating layer;

wherein said first shield pattern has a concave slit from an edge of said first shield pattern toward a center of said first shield pattern.

2. The method of manufacturing a semiconductor device as claimed in claim 1, wherein said first shield pattern is comprising a first conductive layer and a second conductive layer on said first conductive layer.

3. The method of manufacturing a semiconductor device as claimed in claim 2, wherein said step of forming said first shield pattern is comprising forming said a first conductive layer on said first insulating layer, forming a sidewall on said first conductive layer, and forming said second conductive layer on said first conductive layer.

4. The method of manufacturing a semiconductor device as claimed in claim 1, wherein said substrate is comprising an mductor area and a transistor area, and said first insulating layer is comprising an element isolating layer at said inductor area and a gate insulating layer at said transistor area.

5. The method of manufacturing a semiconductor device as claimed in claim 4, wherein said step of forming said first insulating layer is comprising forming the first insulating layer, patterning said first insulating layer to expose a first part of said substrate at said inductor area, patterning said first insulating layer to expose a second part of said substrate at said transistor area, and forming a gate insulating layer on said second part of said substrate on said transistor area.

6. The method of manufacturing a semiconductor device as claimed in claim 5, wherein said first shield pattern is comprising a first conductive layer and a second conductive layer on said first conductive layer.

7. The method of manufacturing a semiconductor device as claimed in claim 6, wherein said step of forming said first shield pattern is comprising forming said first conductive layer on said element isolating layer at said inductor area, forming said first conductive layer on said gate insulating layer at said transistor area, forming a sidewall on said first conductive layer, and forming said second conductive layer on said first conductive layer.

8. The method of manufacturing a semiconductor device as claimed in claim 6, wherein said inductor pattern is formed at said inductor area.

9. The method of manufacturing a semiconductor device as claimed in claim 1, wherein said substrate is comprising an inductor area and a transistor area, and
wherein said step of forming said first insulating layer is comprising forming the first insulating layer, patterning said first insulating layer to expose a first part of said substrate on said inductor area and a second part of said substrate on said transistor area, forming gate insulating layer on said first part of said substrate on said inductor area to expose at a region corresponding to said concave slit, and forming a gate insulating layer on said second part of said substrate on said transistor area.

10. The method of manufacturing a semiconductor device as claimed in claim 9, wherein said shield pattern is comprising a first conductive layer and a second conductive layer on said first conductive layer.

11. The method of manufacturing a semiconductor device as claimed in claim 10, wherein said step of forming said first shield pattern is comprising forming said first conductive layer on said gate insulating layer at said inductor area, forming said first conductive layer on said gate insulating layer at said transistor area, forming a sidewall on said first conductive layer, and forming said second conductive layer on said first conductive layer.

12. The method of manufacturing a semiconductor device as claimed in claim 11, wherein said inductor pattern is formed at said inductor area.

13. The method of manufacturing a semiconductor device as claimed in claim 9 further comprising:
forming a contact hole in said second insulating layer to expose said concave slit of said second shield pattern and said first shield pattern where is adjacent to said concave slit.

14. A semiconductor device comprising:
a substrate;
a first insulating layer on said substrate;
a first shield pattern, said first shield pattern over said first insulating layer, having a concave slit from an edge of said first shield pattern toward a center of said first shield pattern;
a second insulating layer on said first shield pattern;
a second shield pattern on said substrate, said second shield pattern being formed at a region under said concave slit of said first shield pattern; and
an inductor on said second insulating layer;

wherein said first insulating layer has a concave slit at a region under said concave slit of said first shield pattern.

15. The semiconductor device as claimed in claim 14, wherein said first shield pattern and second shield pattern are connected by at least one through hole which is formed in said first insulating layer.

16. The semiconductor device as claimed in claim 15, wherein said first shield pattern and second shield pattern a connected by a ground connection to a ground power source.

17. A semiconductor device comprising:
a substrate;
a first shield pattern on said substrate, said shield pattern having a concave slit from an edge of said first shield pattern toward a center of said first shield pattern;
a first insulating layer on said concave slit;
a second shield pattern on said first insulating layer;
a second insulating layer on said second shield pattern; and
an inductor on said second insulating layer.

18. The semiconductor device as claimed in claim 17, wherein said first shield pattern and second shield pattern arm connected by at least one through hole which is formed in said first insulating layer.

19. The semiconductor device as claimed in claim 18, wherein said first shield pattern and second shield pattern are connected by a ground connection to a ground power source.

20. A semiconductor device comprising:
a semiconductor substrate;
a first insulating layer formed on said semiconductor substrate;
a first shield layer formed over said first insulating layer;
a first slit selectively formed in said first shield layer to thereby define a part of said semiconductor substrate that is free from being covered with said first shield layer;
a second insulating layer covering said first shield layer and said first insulating layer;
an inductor formed on said second insulating layer; and
a second shield layer provided separately from said first shield layer to cover said part of said semiconductor substrate.

21. The semiconductor device as claimed in claim 20, wherein said second shield layer under said first insulating layer in contact with said part of said semiconductor substrate.

22. The semiconductor device as claimed in claim 21, wherein said second shield layer comprises a silicide layer.

23. A method of manufacturing a semiconductor device comprising:
forming a first insulating layer on a substrate to expose a part of said substrate;
forming a first shield pattern over said first insulating layer;
forming a second shield pattern on said part of said substrate;
forming a second insulating layer; and
forming an inductor pattern on said second insulating layer;
wherein said first shield pattern has a concave slit, said concave slit defined by at least a first edge and second edge of said first shield pattern, wherein a lateral distance spans between said first and second edges, said concave slit positioned from an edge of said first shield pattern laterally toward a center of said first shield pattern.

24. A semiconductor device comprising:

a substrate;

a first insulating layer on said substrate;

a first shield pattern, said first shield pattern over said first insulating layer, having a concave slit, said concave slit defined by at least a first edge and second edge of said first shield pattern, wherein a lateral distance spans between said first and second edges, said concave slit positioned from an edge of said first shield pattern laterally toward a center of said first shield pattern;

a second insulating layer on said first shield pattern;

a second shield pattern on said substrate, said second shield pattern being formed at a region under said concave slit of said first shield pattern; and an inductor on said second insulating layer;

wherein said first insulating layer has a concave slit at a region under said concave slit of said first shield pattern.

25. A semiconductor device comprising:

a substrate;

a first shield pattern on said substrate, said shield pattern having a concave slit, said concave slit defined by at least a first edge and second edge of said first shield pattern, wherein a lateral distance spans between said first and second edges, said concave slit positioned from an edge of said first shield pattern laterally toward a center of said first shield pattern;

a first insulating layer on said concave slit;

a second shield pattern on said first insulating layer;

a second insulating layer on said second shield pattern; and an inductor on said second insulating layer.

* * * * *